United States Patent
Chen et al.

(10) Patent No.: US 8,482,073 B2
(45) Date of Patent: Jul. 9, 2013

(54) INTEGRATED CIRCUIT INCLUDING FINFETS AND METHODS FOR FORMING THE SAME

(75) Inventors: Hung-Ming Chen, Hsinchu (TW); Shao-Ming Yu, Zhubei (TW); Chang-Yun Chang, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 151 days.

(21) Appl. No.: 12/731,411

(22) Filed: Mar. 25, 2010

(65) Prior Publication Data

US 2011/0233679 A1    Sep. 29, 2011

(51) Int. Cl.
*H01L 29/06* (2006.01)
*H01L 29/16* (2006.01)
*H01L 29/772* (2006.01)

(52) U.S. Cl.
USPC .............. 257/368; 257/E27.06; 257/E21.131; 438/300

(58) Field of Classification Search
None
See application file for complete search history.

(56) References Cited

U.S. PATENT DOCUMENTS

| | | |
|---|---|---|
| 5,581,202 A | 12/1996 | Yano et al. |
| 5,658,417 A | 8/1997 | Watanabe et al. |
| 5,767,732 A | 6/1998 | Lee et al. |
| 5,949,986 A | 9/1999 | Riley et al. |
| 5,963,789 A | 10/1999 | Tsuchiaki |
| 6,065,481 A | 5/2000 | Fayfield et al. |
| 6,121,786 A | 9/2000 | Yamagami et al. |
| 6,299,724 B1 | 10/2001 | Fayfield et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,713,365 B2 | 3/2004 | Lin et al. |

(Continued)

FOREIGN PATENT DOCUMENTS

| | | |
|---|---|---|
| CN | 1945829 | 4/2004 |
| CN | 101179046 | 5/2005 |

(Continued)

OTHER PUBLICATIONS

Ananthan, Hari, Aditya Bansal, and Kaushik Roy. "FinFET SRAM—Device and Circuit Design Considerations." Quality Electronic Design, 2004. Proceedings. 5th International Symposium on (2004): 511-16.*

(Continued)

*Primary Examiner* — Thomas L Dickey
*Assistant Examiner* — Joseph Schoenholtz
(74) *Attorney, Agent, or Firm* — Lowe Hauptman Ham & Berner, LLP

(57) ABSTRACT

An integrated circuit including a plurality of Fin field effect transistors (FINFETs) is provided. The integrated circuit includes a plurality of fin-channel bodies over a substrate. The fin-channel bodies include a first fin-channel body and a second fin-channel body. A gate structure is disposed over the fin-channel bodies. At least one first source/drain (S/D) region of a first FINFET is adjacent the first fin-channel body. At least one second source/drain (S/D) region of a second FINFET is adjacent the second fin-channel body. The at least one first S/D region is electrically coupled with the at least one second S/D region. The at least one first and second S/D regions are substantially free from including any fin structure.

22 Claims, 21 Drawing Sheets

U.S. PATENT DOCUMENTS

| | | |
|---|---|---|
| 6,727,557 B2 | 4/2004 | Takao |
| 6,740,247 B1 | 5/2004 | Han et al. |
| 6,743,673 B2 | 6/2004 | Watanabe et al. |
| 6,762,448 B1 | 7/2004 | Lin et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1* | 3/2005 | Yu et al. ............... 438/585 |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2* | 9/2006 | Ko et al. ............... 438/300 |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 | 11/2007 | Oh et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2* | 4/2008 | Shin et al. ............... 438/300 |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2* | 10/2008 | Ko et al. ............... 257/192 |
| 7,456,087 B2* | 11/2008 | Cheng ............... 438/584 |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2* | 5/2009 | Tsai ............... 257/327 |
| 7,538,391 B2 | 5/2009 | Chidambarrao et al. |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,795,097 B2 | 9/2010 | Pas |
| 7,798,332 B1 | 9/2010 | Brunet |
| 7,820,513 B2* | 10/2010 | Hareland et al. ............... 438/283 |
| 7,851,865 B2* | 12/2010 | Anderson et al. ............... 257/365 |
| 7,868,317 B2* | 1/2011 | Yu et al. ............... 257/18 |
| 7,898,041 B2* | 3/2011 | Radosavljevic et al. ...... 257/401 |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2* | 8/2011 | Shi et al. ............... 438/283 |
| 8,043,920 B2* | 10/2011 | Chan et al. ............... 438/300 |
| 8,076,189 B2* | 12/2011 | Grant ............... 438/197 |
| 8,101,475 B2 | 1/2012 | Oh et al. |
| 2002/0144230 A1 | 10/2002 | Rittman |
| 2003/0080361 A1* | 5/2003 | Murthy et al. ............... 257/288 |
| 2003/0109086 A1 | 6/2003 | Arao |
| 2003/0145299 A1 | 7/2003 | Fried et al. |
| 2003/0234422 A1 | 12/2003 | Wang et al. |
| 2004/0048424 A1 | 3/2004 | Wu et al. |
| 2004/0075121 A1 | 4/2004 | Yu et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0233598 A1 | 10/2005 | Jung et al. |
| 2005/0266698 A1 | 12/2005 | Cooney et al. |
| 2005/0280102 A1* | 12/2005 | Oh et al. ............... 257/401 |
| 2006/0038230 A1* | 2/2006 | Ueno et al. ............... 257/351 |
| 2006/0068553 A1 | 3/2006 | Thean et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0153995 A1 | 7/2006 | Narwankar et al. |
| 2006/0166475 A1 | 7/2006 | Mantl |
| 2006/0214212 A1 | 9/2006 | Horita et al. |
| 2006/0258156 A1 | 11/2006 | Kittl |
| 2007/0001173 A1 | 1/2007 | Brask et al. |
| 2007/0004218 A1 | 1/2007 | Lee et al. |
| 2007/0015334 A1 | 1/2007 | Kittl et al. |
| 2007/0020827 A1 | 1/2007 | Buh et al. |
| 2007/0024349 A1 | 2/2007 | Tsukude |
| 2007/0026615 A1 | 2/2007 | Goktepeli et al. |
| 2007/0029576 A1 | 2/2007 | Nowak et al. |
| 2007/0048907 A1 | 3/2007 | Lee et al. |
| 2007/0063276 A1 | 3/2007 | Beintner |
| 2007/0076477 A1 | 4/2007 | Hwang et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1* | 1/2008 | Tezuka et al. ............... 257/191 |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1* | 5/2008 | Cook et al. ............... 438/300 |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0309162 A1 | 12/2009 | Baumgartner et al. |
| 2009/0321836 A1* | 12/2009 | Wei et al. ............... 257/365 |
| 2010/0155790 A1* | 6/2010 | Lin et al. ............... 257/288 |

| | | | |
|---|---|---|---|
| 2010/0163926 | A1 | 7/2010 | Hudait et al. |
| 2010/0183961 | A1 | 7/2010 | Shieh et al. |
| 2010/0187613 | A1 | 7/2010 | Colombo et al. |
| 2010/0207211 | A1 | 8/2010 | Sasaki et al. |
| 2010/0308379 | A1 | 12/2010 | Kuan et al. |
| 2011/0018065 | A1 | 1/2011 | Curatola et al. |
| 2011/0108920 | A1 | 5/2011 | Basker et al. |
| 2011/0129990 | A1 | 6/2011 | Mandrekar et al. |
| 2011/0195555 | A1 | 8/2011 | Tsai et al. |
| 2011/0195570 | A1 | 8/2011 | Lin et al. |
| 2011/0256682 | A1 | 10/2011 | Yu et al. |
| 2012/0086053 | A1 | 4/2012 | Tseng et al. |

FOREIGN PATENT DOCUMENTS

| | | |
|---|---|---|
| CN | 1011459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |
| WO | WO2007/115585 | 10/2007 |
| WO | WO 2007115585 A1 * | 10/2007 |

OTHER PUBLICATIONS

Jha, Niraj. "Low-power FinFET Circuit Design." Dept of Elecrical Engineering, Princeton University n.d.*
Kedzierski, J., Meikei Ieong, E. Nowak, T.S. Kanarsky, Ying Zhang, R. Roy, D. Boyd, D. Fried, and H.-S.P. Wong. "Extension and Source/drain Design for High-performance FinFET Devices." IEEE Transactions on Electron Devices 50.4 (2003): 952-58.*
Liow, Tsung-Yang. "Strained N-Channel FinFETs with 25 Nm Gate Length and Silicon-Carbon Source/Drain Regions for Performance Enhancement." VLSI Technology, 2006. Digest of Technical Papers. 2006 Symposium on VLSI TEchnology 2006: 56-57.*
James P. McVittie, Juan C. Rey, A. J. Bariya, M. M. IslamRaja, L. Y. Cheng, S. Ravi and Krishna C. Saraswat, "SPEEDIE: a profile simulator for etching and deposition", Proc. SPIE 1392, 126 (1991).*
90 nm Technology. retreieved from the internet <URL:http://www.tsmc.com/english/dedicatedFoundry/technology/90nm.htm.*
Merriam Webster definition of substantially retrieved from the internet <URL:http://www.merriam-webster.com/dictionary/substantial>.*
Smith, Casey Eben. Advanced Technology for Source Drain Resistance. Diss. University of North Texas, 2008.*
Tsung-Yang Liow, et.al., "Strained N-Channel FinFETs Featuring In Situ Doped Silicon—Carbon Si1—YCy Source and Drain Stressors With High Carbon Content." IEEE Transactions on Electron Devices 55.9 (2008): 2475-483.*
TSMC 90nm Technology downloaded from URL <http://www.tsmc.com/english/dedicatedFoundry/technology/90nm.htm> on Feb. 16, 2013.*
Substantially Definition downloaded from URL <http://www.merriam-webstercom/dictionary/substantially> on Feb. 16, 2013.*
Hiraj K. Jha "Low Power FinFET Circuit Design", downloaded from URL <http://www.ee.cycu.edu.tw/excellent/lab/speech/ppt/17.FinFET.ppt?bcsi-ac-87a1566f7576e15c=2012E8AD00000102-hqJiE1cNvwqkfwraTB5FkXgKc2TBCgAAAgEAAAhbKACE-AwAAAAAAAMSPEQA=> on Feb. 18, 2013.*
Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.
Shikida, Mitsuhiro, et al., "Comparison of Anisotropic Etching Properties Between KOH and TMAH Solutions", IEEE Xplore, Jun. 30, 2010, pp. 315-320.
Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore, IEEE 2005.
Jha, Niraj, Low-Power FinFET Circuit Design, Dept. of Electrical Engineering, Princeton University n.d.
90 nm Technology. retrieved from the Internet <URL:http://tsmc.com/english/dedicatedFoundry/technology/90nm.htm.
Office Action dated May 2, 2012 from corresponding application No. CN 201010196345.0.
Office Action dated May 4, 2012 from corresponding application No. CN 201010243667.6.
Office Action dated Jun. 20, 2012 from corresponding application No. CN 201010263807.6.
Anathan, Hari, et al., "FinFet SRAM—Device and Circuit Design Considerations", Quality Electronic Design, 2004, Proceedings 5th International Symposium (2004); pp. 511-516.
Kedzierski, J., et al., "Extension and Source/Drain Design for High-Performance FinFET Devices", IEEE Transactions on Electron Devices, vol. 50, No. 4, Apr. 2003, pp. 952-958.
Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.
Quirk et al., Semiconductor Manufacturing Technology, Oct. 2001, Prentice Hall, Chapter 16.
McVittie, James P., et al., "SPEEDIE: A Profile Simulator for Etching and Deposition", Proc. SPIE 1392, 126 (1991).
Smith, Casey Eben, Advanced Technology for Source Drain Resistance, Diss. University of North Texas, 2008.
Liow, Tsung-Yang et al., "Strained N-Channel FinFETs Featuring in Situ Doped Silicon-Carbon Si1-YCy Source Drain Stressors with High Carbon Content", IEEE Transactions on Electron Devices 55.9 (2008): 2475-483.
Office Action dated Mar. 28, 2012 from corresponding application No. CN 201010228334.6.
Notice of Decision on Patent dated Mar. 12, 2012 from corresponding application No. 10-2010-0072103.
OA dated Mar. 27, 2012 from corresponding application No. KR10-2010-0094454.
OA dated Mar. 29, 2012 from corresponding application No. KR10-2010-0090264.

* cited by examiner

INTEGRATED CIRCUIT INCLUDING FINFETS AND METHODS FOR FORMING THE SAME

CROSS-REFERENCE TO RELATED APPLICATIONS

The present application is related to U.S. patent application Ser. Nos. 12/707,788, filed on Feb. 18, 2010, titled MEMORY POWER GATING CIRCUIT AND METHODS; 12/758,426, filed on Apr. 12, 2010, titled FINFETS AND METHODS FOR FORMING THE SAME; 12/731,325, filed on Mar. 25, 2010, titled ELECTRICAL FUSE AND RELATED APPLICATIONS; 12/724,556, filed on Mar. 16, 2010, titled ELECTRICAL ANTI-FUSE AND RELATED APPLICATIONS; 12/757,203, filed on Apr. 9, 2010, titled STI STRUCTURE AND METHOD OF FORMING BOTTOM VOID IN SAME; 12/797,839, filed on Jun. 10, 2010, titled FIN STRUCTURE FOR HIGH MOBILITY MULTIPLE-GATE TRANSISTOR; 12/831,842, filed on Jul. 7, 2010, titled METHOD FOR FORMING HIGH GERMANIUM CONCENTRATION SiGe STRESSOR; 12/761,686, filed on Apr. 16, 2010, titled FINFETS AND METHODS FOR FORMING THE SAME; 12/766,233, filed on Apr. 23, 2010, titled FIN FIELD EFFECT TRANSISTOR; 12/757,271, filed on Apr. 9, 2010, titled ACCUMULATION TYPE FINFET, CIRCUITS AND FABRICATION METHOD THEREOF; 12/694,846, filed on Jan. 27, 2010, titled INTEGRATED CIRCUITS AND METHODS FOR FORMING THE SAME; 12/638,958, filed on Dec. 14, 2009, titled METHOD OF CONTROLLING GATE THICKNESS IN FORMING FINFET DEVICES; 12/768,884, filed on Apr. 28, 2010, titled METHODS FOR DOPING FIN FIELD-EFFECT TRANSISTORS; 12/731,411, filed on Mar. 25, 2010, titled INTEGRATED CIRCUIT INCLUDING FINFETS AND METHODS FOR FORMING THE SAME; 12/775,006, filed on May 6, 2010, titled METHOD FOR FABRICATING A STRAINED STRUCTURE; 12/886,713, filed Sep. 21, 2010, titled METHOD OF FORMING INTEGRATED CIRCUITS; 12/941,509, filed Nov. 8, 2010, titled MECHANISMS FOR FORMING ULTRA SHALLOW JUNCTION; 12/900,626, filed Oct. 8, 2010, titled TRANSISTOR HAVING NOTCHED FIN STRUCTURE AND METHOD OF MAKING THE SAME; 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The present application relates generally to the field of semiconductor devices, and more particularly, to integrated circuits including Fin field effect transistors (FINFETS) and methods for forming the integrated circuit.

BACKGROUND

The semiconductor integrated circuit (IC) industry has experienced rapid growth. Technological advances in IC materials and design have produced generations of ICs where each generation has smaller and more complex circuits than the previous generation. For example, the semiconductor industry ardently strives to decrease the size of memory cells. One approach that has been proposed includes the use of multiple gate transistors, otherwise known as Fin field effect transistors (FINFETS).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-7A are schematic top views illustrating an exemplary method of forming an exemplary integrated circuit including a plurality of FINFETs.

FIGS. 2B-7B are schematic cross-sectional views of structures shown in FIGS. 2A-7A, respectively, taken along section lines 2B-2B to 7B-7B, respectively.

FIGS. 2C-7C are schematic cross-sectional views of structures shown in FIGS. 2A-7A, respectively, taken along section lines 2C-2C to 7C-7C, respectively.

DETAILED DESCRIPTION

Figure 1A:
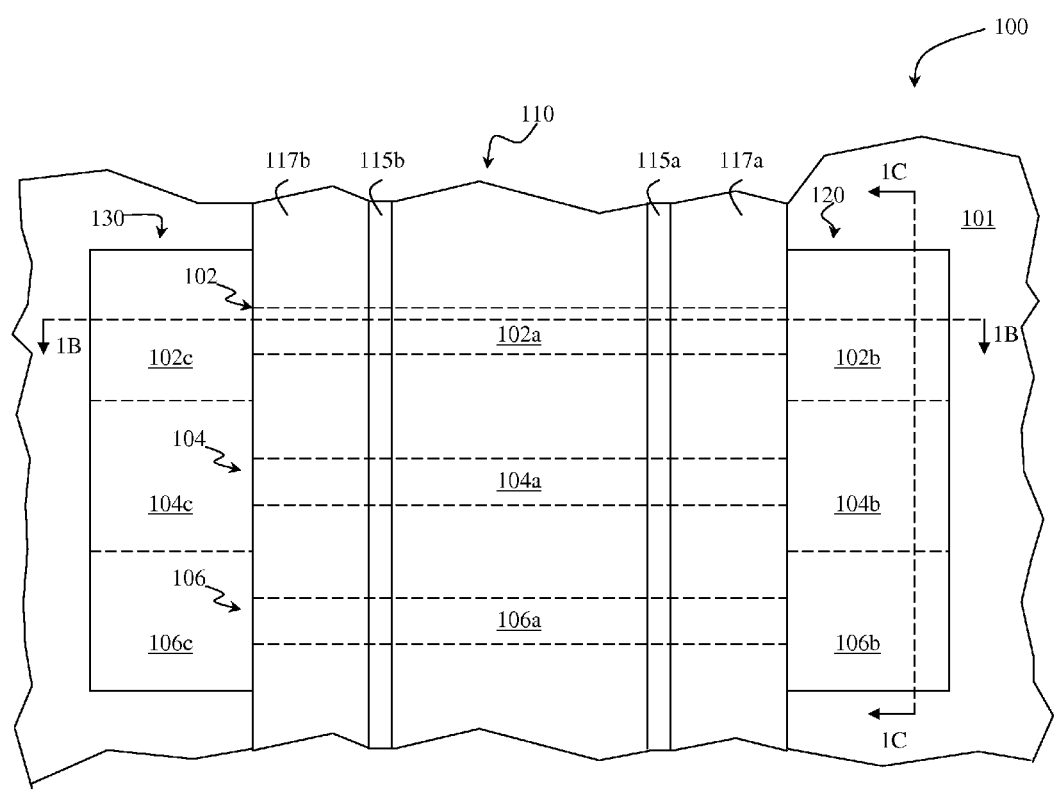
FIG. 1A is a schematic drawing illustrating a top view of an exemplary integrated circuit including a plurality of Fin field effect transistors (FINFETs).

A conventional FINFET device is fabricated using a silicon fin raised from a semiconductor substrate. The channel of the device is formed in the fin, and a gate is provided over the fin—for example, in contact with the top and the sidewalls of the fin. The gate surrounding the channel (e.g., fin) is beneficial in that allows control of the channel from three sides. Source/drain regions are formed at two ends of the fin.

It is understood that the following disclosure provides many different embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1B:
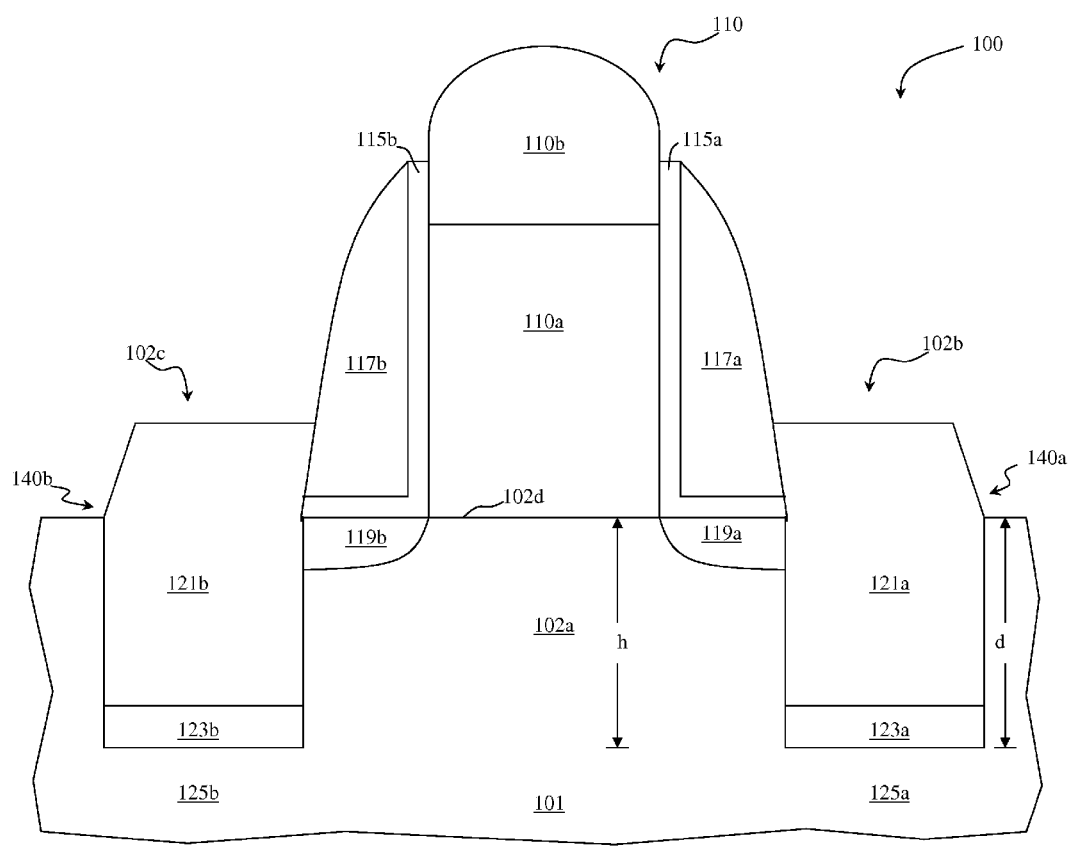
FIGS. 1B and 1C are schematic cross-sectional views of the integrated circuit shown in FIG. 1A taken along section lines 1B-1B and 1C-1C, respectively.
Figure 1C:
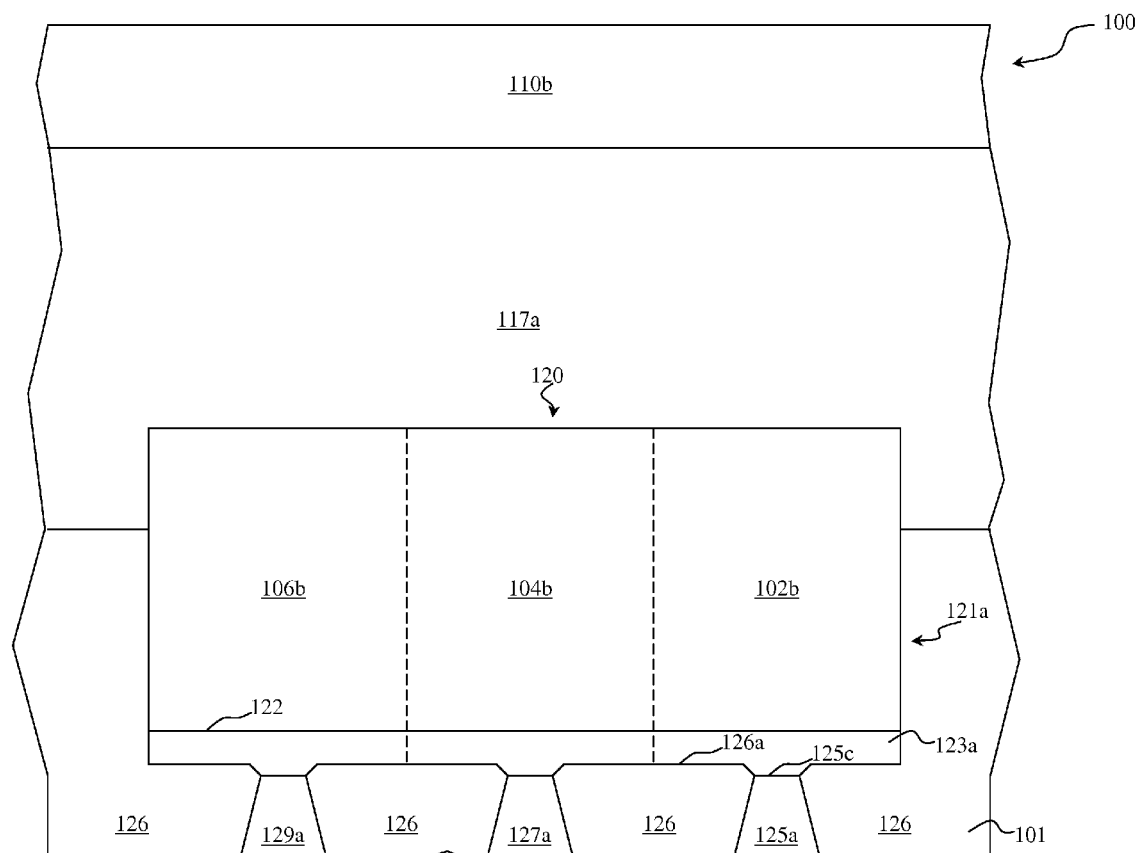

FIG. 1A is a schematic drawing illustrating a top view of an exemplary integrated circuit including a plurality of Fin field effect transistors (FINFETs). FIGS. 1B and 1C are schematic cross-sectional views of the integrated circuit shown in FIG. 1A taken along section lines 1B-1B and 1C-1C, respectively. In FIG. 1A, an integrated circuit 100 can include a plurality of Fin field effect transistors (FINFETs), e.g., FINFETs 102, 104, and 106, disposed over a substrate 101. The integrated circuit 100 can comprise a plurality of fin-channel bodies, e.g., the fin-channel bodies 102a, 104a, and 106a, of the FINFETs 102, 104, and 106, respectively, over the substrate 101. A gate structure 110 can be disposed over and substantially orthogonal to the fin-channel bodies 102a, 104a, and 106a.

It is noted that the fin-channel bodies 102a, 104a, and 106a are disposed below the gate structure 110. The fin-channel bodies 102a, 104a, and 106a cannot be seen from the top view of the integrated circuit 100. The fin-channel bodies 102a, 104a, and 106a are represented with dot lines shown in FIG. 1A to indicate their locations in the integrated circuit 100.

In some embodiments, each of the fin-channel bodies 102a, 104a, and 106a can be a body that has a fin structure and is merely used for providing a channel between source/drain (S/D) regions. In other embodiments, each of the fin-channel bodies 102a, 104a, and 106a can be a fin-channel body that is merely covered by the gate structure 110. In still other embodiments, each of the fin-channel bodies 102a, 104a, and 106a can be a fin-channel body that is covered by the gate structure 110, liners 115a-115b, and spacers 117a-117b that are adjacent sidewalls of the gate structure 110.

In some embodiments, the fin-channel bodies 102a, 104a, and 106a can be disposed over the substrate 101. In other embodiments, the fin-channel bodies 102a, 104a, and 106a can rise from the substrate 101 toward the gate structure 110. In still other embodiments, the fin-channel bodies 102a, 104a, and 106a can be defined at a top portion of a substrate wafer. The bottom portion of the substrate wafer can be referred to as the substrate 101.

In some embodiments, the substrate 101 and/or the fin-channel bodies 102a, 104a, and 106a can be made of at least one elementary semiconductor including silicon or germanium in crystalline, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the substrate 101 and/or the fin-channel bodies 102a, 104a, and 106a may have a gradient SiGe feature in which the Si and Ge composition can change from one ratio at one location to another ratio at another location of the gradient SiGe feature. In another embodiment, the gradient SiGe feature is formed over a silicon substrate. In the other embodiment, the gradient SiGe feature is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

Referring to FIG. 1A, the FINFETs 102, 104, and 106 can include at least one source/drain region, e.g., S/D regions 102b-102c, 104b-104c, and 106b-106c, respectively. The source/drain (S/D) region 104b and 104c can be disposed between the S/D regions 102b, 106b and 102c, 106c, respectively. In some embodiments, the S/D regions 102b, 104b, and 106b are substantially free from including any fin structure.

It is noted the dot lines among the S/D regions 102b-102c, 104b-104c, and 106b-106c are merely exemplary to indicate interfaces between the S/D regions 102b-102c and 104b-104c, and between the S/D regions 104b-104c and 106b-106c. In some embodiments, the S/D regions 102b-102c, 104b-104c, and 106b-106c may have the same dimension. In other embodiments, the interfaces may shift and the S/D regions 102b-102c, 104b-104c, and 106b-106c may have different dimensions.

In some embodiments, the S/D regions 102b, 104b, and 106b can include at least one strain structure, e.g., a strain structure 120, adjacent the fin-channel bodies 102a, 104a, and 106a. The S/D regions 102c, 104c, and 106c can include at least one strain structure, e.g., a strain structure 130, adjacent the fin-channel bodies 102a, 104a, and 106a. The strain structures 120 and 130 can provide a desired strain stress, compressive or tensile, to channels (not labeled) of the FINFETs 102, 104, and 106.

Referring again to FIG. 1A, the strain structures 120 and 130 can be disposed substantially parallel with gate structure 110. Though the rectangular strain structures 120 and 130 are shown in FIG. 1A, the scope of this application is not limited thereto. In some embodiments, the strain structures 120a and 130 can be disposed around the gate structure 110 from the top view of the integrated circuit 100. The strain structures 120a and 130a can meet each other, showing a single strain structure around the gate structure 110.

In some embodiments, the S/D regions 102a-102b, 104a-104b, and 106a-106b can include dopants. In some embodiments forming n-type FINFETs, the S/D regions 102a-102b, 104a-104b, and 106a-106b can have dopants such as arsenic (As), phosphorus (P), another group V element, or any combinations thereof. In other embodiments forming p-type FINFETs, the S/D regions 102a-102b, 104a-104b, and 106a-106b can have dopants such as boron (B), another group III element, or any combinations thereof. In some embodiments, the S/D regions 102a-102b, 104a-104b, and 106a-106b can each include a single layer, or a multi-layer structure, e.g., a bi-layer structure, a tri-layer structure, or another multi-layer structure. For example, a bi-layer structure can include a SiGe layer over a Si layer.

In some embodiments, the FINFETs 102, 104, and 106 can each include a silicide structure (not shown) that can be disposed on top surfaces of the S/D regions 102a-102b, 104a-104b, and 106a-106b. The silicide structure may comprise at least one material, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or any combinations thereof.

Referring to FIG. 1B, the FINFET 102 can include the fin-channel body 102a that can be disposed over the substrate 101. The fin-channel body 102a can be disposed between the S/D regions 102b and 102c. The gate structure 110 can include a gate electrode 110a below a cap layer 110b. The cap layer 110b can include at least one material, such as silicon oxide, silicon nitride, silicon oxynitride (SiON), silicon oxycarbide (SiOC), silicon carbon nitride (SiCN), silicon carbon oxynitride (SiCON), silicon carbide (SiC), another dielectric material, or any combinations thereof. In some embodiments, the cap layer 110b can be made of a dielectric material that is similar to the material of the liners 115a and 115b.

In some embodiments, the gate electrode 110a can include at least one material, such as polysilicon, silicon-germanium, a metallic material including at least one metal compound, such as aluminum (Al), molybdenum (Mo), copper (Cu), tungsten (W), titanium (Ti), tantalum (Ta), titanium nitride (TiN), tantalum nitride (TaN), nickel silicide (NiSi), cobalt silicide (CoSi), other suitable conductive materials known in the art, or any combinations thereof. In other embodiments, the gate electrode 110a can include a polysilicon layer over a metallic layer. In still other embodiments, the gate electrode 110a can include a work function metal layer such that it provides an N-metal work function or a P-metal work function of a metal gate. P-type work function materials can include compositions such as ruthenium, palladium, platinum, cobalt, nickel, and conductive metal oxides, and/or other suitable materials. N-type metal materials can include compositions such as hafnium, zirconium, titanium, tantalum, aluminum, metal carbides (e.g., hafnium carbide, zirconium carbide, titanium carbide, aluminum carbide), aluminides, and/or other suitable materials.

Figure 2A:
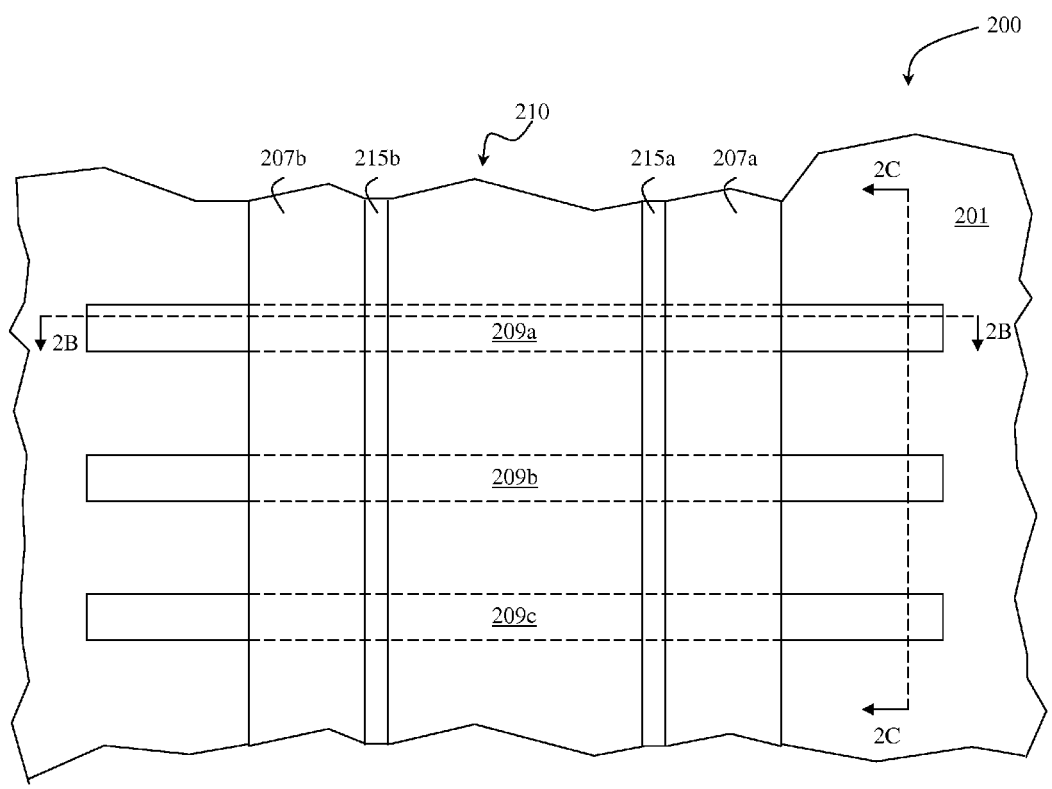
Figure 2B:
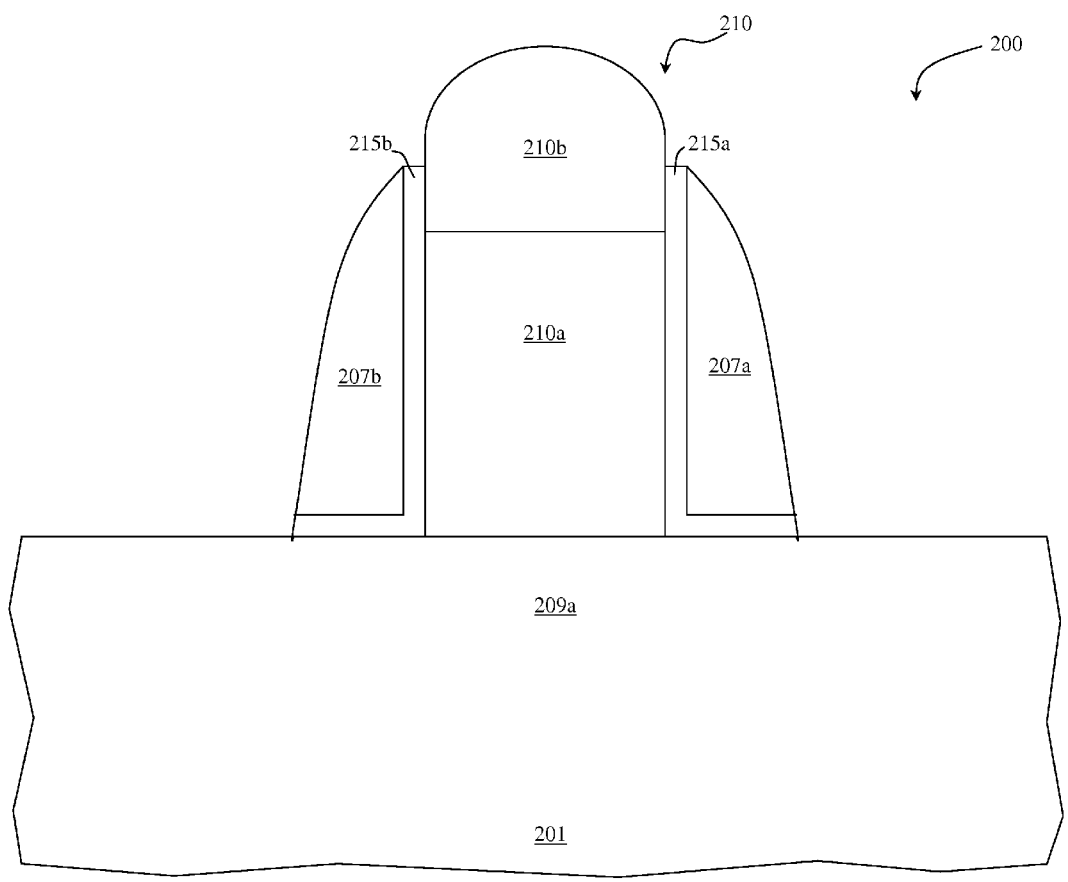

In some embodiments, a gate dielectric (not shown) can be disposed between the gate electrode 110a and the fin-channel body 102a (shown in FIG. 2B). The gate dielectric can be a single layer or a multi-layer structure. In embodiments using a multi-layer structure, the gate dielectric can include an interfacial layer and a high-k dielectric layer. The interfacial layer can include dielectric material such as, silicon oxide, silicon nitride, silicon oxinitride, one or more dielectric material, or any combinations thereof. The high-k dielectric layer can include at least one high-k dielectric material such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or any combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof.

In some embodiments, the liners 115a and 115b can be disposed on sidewalls of the gate electrode 110a and over the fin-channel body 102a. The spacers 117a and 117b can be disposed over the liners 115a and 115b, respectively, adjacent the gate electrode 110a. Each of the liners 115a and 115b can include at least one material, such as silicon oxide, silicon nitride, silicon oxynitride (SiON), silicon oxycarbide (SiOC), silicon carbon nitride (SiCN), silicon carbon oxynitride (SiCON), silicon carbide (SiC), another dielectric material, or any combinations thereof. Each of the spacers 117a and 117b can include at least one material, such as silicon oxide, silicon nitride, silicon oxynitride (SiON), silicon oxycarbide (SiOC), silicon carbon nitride (SiCN), silicon carbon oxynitride (SiCON), silicon carbide (SiC), another dielectric material, or any combinations thereof. In some embodiments, the cap layer 110b and the liners 115a-115b to the spacers 117a-117b can have a desired etch selectivity, e.g., 1:10 or less. In other embodiments, the cap layer 110b and the liners 115a-115b can be made of silicon oxide and the spacers 117a-117b can be made of silicon nitride or silicon oxynitride.

In some embodiments, the FINFET 102 can include lightly-doped drains (LDDs) 119a and 119b that are defined under the spacers 117a and 117b, respectively. For some embodiments forming n-type FINFETs, the LDDs 119a and 119b can have dopants such as arsenic (As), phosphorus (P), another group V element, or any combinations thereof. For some embodiments forming p-type FINFETs, the LDDs 119a and 119b can have dopants such as boron (B), another group III element, or any combinations thereof.

In some embodiments, the integrated circuit 100 can include at least one opening, e.g., trench openings 140a and 140b, defined substantially parallel with the gate structure 110. The S/D regions 102b and 102c can include portions of epitaxial regions 121a and 121b over portions of epitaxial regions 123a and 123b, respectively (shown in FIG. 1B). The epitaxial regions 121a, 123a and the epitaxial regions 121b, 123b can be disposed in the trench openings 140a and 140b, respectively. In some embodiments, the epitaxial regions 123a and 123b can be disposed over active areas 125a and 125b of the substrate 101, respectively. It is noted that the trench openings 140a and 140b shown in FIG. 1 are merely exemplary. In other embodiments, a single trench opening can be defined, continuously extending around the gate structure 110 from the top view of the integrated circuit 100.

In some embodiments, the epitaxial regions 121a and 121b are disposed more adjacent to a channel (not labeled) of the FINFET 102 than the epitaxial regions 123a and 123b. The channel can be a region of the fin-channel body 102a that is covered by the gate electrode 110a. In other embodiments, the epitaxial regions 121a and 121b can provide a larger strain to the fin-channel body 102a than the epitaxial regions 123a and 123b. The height of the epitaxial regions 121a-121b can be larger than that of the epitaxial regions 123a-123b. In still other embodiments, the epitaxial regions 121a and 121b can extend over a top surface 102d of the fin-channel body 102a. The trench opening 140a can have a depth "d" that is substantially equal to a height "h" of the fin-channel body 102a.

In some embodiments, each of the epitaxial regions 121a-121b and 123a-123b can include at least one elementary semiconductor such as silicon, germanium, or carbon; compound semiconductor such as silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In other embodiments, each of the epitaxial regions 121a-121b and 123a-123b may have a gradient SiGe feature in which the Si and Ge composition can change from one ratio at one location to another ratio at another location of the gradient SiGe feature. In still other embodiments, each of the epitaxial regions 121a-121b and 123a-123b can include a multilayer structure or a multilayer compound semiconductor structure.

Referring to again to FIG. 1B, the epitaxial regions 121a-121b and/or 123a-123b can provide a stress, e.g., a compressive stress or a tensile stress, to the fin-channel body 102a. The compressed or tensed fin-channel body 102a can provide a desired electron mobility or hole mobility for the FinFET 102. In embodiments providing a compressive stress, the fin-channel body 102a can have a Si material and the epitaxial regions 121a-121b and/or 123a-123b can have a SiGe material. In other embodiments providing a compressive stress, the fin-channel body 102a and the epitaxial regions 121a-121b and/or 123a-123b can have a SiGe material. The epitaxial regions 121a-121b and/or 123a-123b can have a germanium concentration higher than that of the fin-channel body 102a.

In embodiments providing a tensile stress, the fin-channel body 102a can have a Si material and the epitaxial regions 121a-121b and/or 123a-123b can have a SiC material. In other embodiments providing a tensile stress, the fin-channel body 102a and the epitaxial regions 121a-121b and/or 123a-123b can have a SiC material. The epitaxial regions 121a-121b and/or 123a-123b can have a carbon concentration higher than that of the fin-channel body 102a.

Referring to FIG. 1C, the cap layer 110b can extend over the spacer 117a. The S/D region 104b can be disposed between the S/D regions 102b and 106b. Each of the S/D regions 102b, 104b, and 106b can include portions of the epitaxial regions 121a and 123a. An interface 122 between the epitaxial regions 121a and 123a can be substantially flat. In some embodiments, the portions of the epitaxial region 123a disposed on the active areas 125a, 127a, and 129a may be separated from each other.

Referring again to FIG. 1C, the substrate 101 can include at least one isolation structure, e.g., an isolation structure 126, disposed in the substrate 101. The isolation structure 126 can be disposed around the active areas 125a, 127a, and 129a, and electrically isolate the active area 125a, 127a, and 129a from each other. In some embodiments, a top surface 126a of the isolation structure 126 can be substantially level with or higher than a top surface 125c of the active area 125a of the substrate 101. In some embodiments, the isolation structure 126 can include a shallow trench isolation (STI) structure, a local oxidation of silicon (LOCOS) structure, one or more isolation structure, or any combination thereof.

FIGS. 2A-7A are schematic top views illustrating an exemplary method of forming an exemplary integrated circuit including a plurality of FINFETs. FIGS. 2B-7B are schematic cross-sectional views of structures shown in FIGS. 2A-7A, respectively, taken along section lines 2B-2B to 7B-7B, respectively. FIGS. 2C-7C are schematic cross-sectional views of structures shown in FIGS. 2A-7A, respectively, taken along section lines 2C-2C to 7C-7C, respectively. Items of FIGS. 2A-7A, 2B-7B, and 2C-7C that are the same items in FIG. 1 are indicated by the same reference numerals, increased by 100.

Figure 2C:
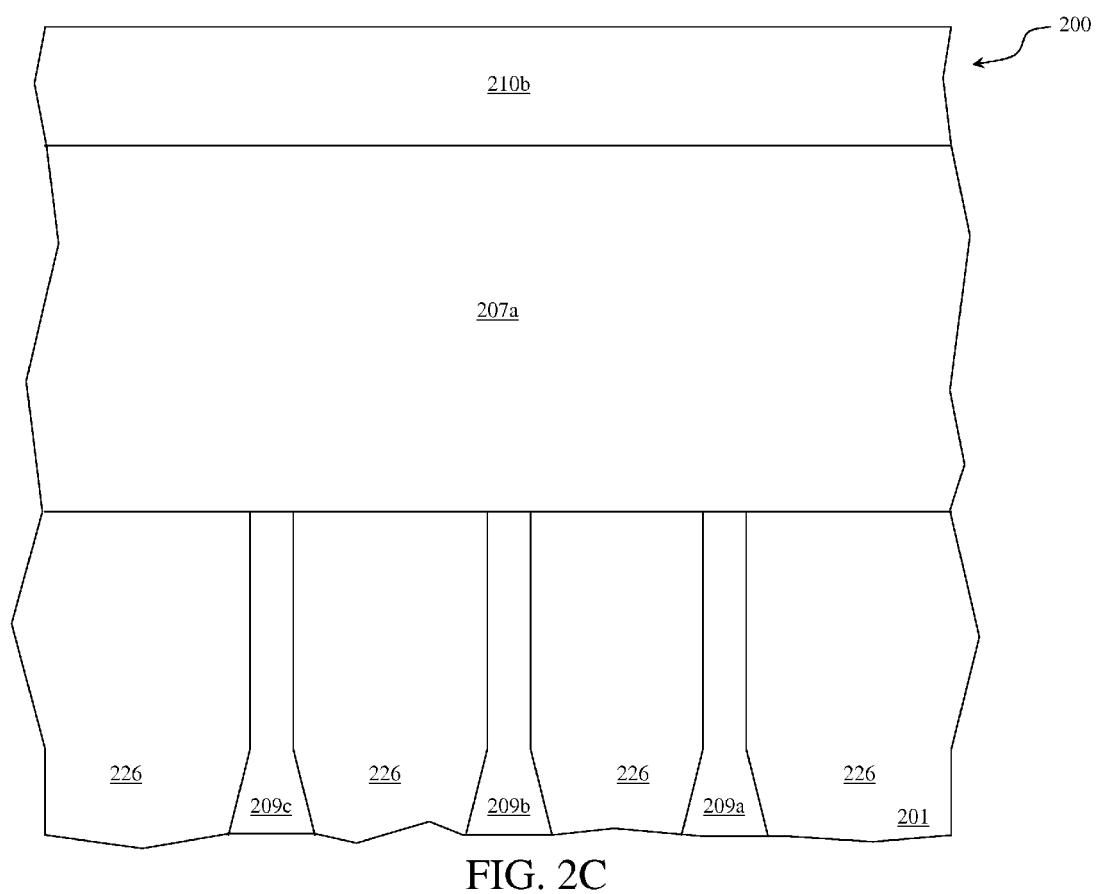

Referring to FIGS. 2A-2C, a plurality of fins 209a-209c can be formed over the substrate 201. A gate structure 210, spacers 207a-207b, and liners 215a-215b can be formed over the fins 209a-209c. At least one isolation structure 226 can be formed around the fins 209a-209c. The fins 209a-209c over the substrate 201 can be defined, for example, by providing a blank substrate wafer. A top surface of the blank substrate wafer is patterned to define the fins 209a-209c. The non-patterned bottom region of the substrate wafer can be referred to as the substrate 201.

In some embodiments, the spacers 207a-207b can be made of silicon oxide, silicon oxynitride, silicon nitride, or other dielectric materials. The cap layer 210b and the liners 215a-215b can be made of silicon nitride, silicon oxynitride, silicon oxide, other dielectric materials that have a desired etch selectivity to the spacers 207a-207b. The isolation structure 226, the gate structure 210, the spacers 207a-207b, the liners 215a-215b can be formed by any known process that can include dielectric deposition steps, etching steps, cleaning steps, lithographic steps, other known semiconductor processes, and/or any combinations thereof.

Figure 3A:
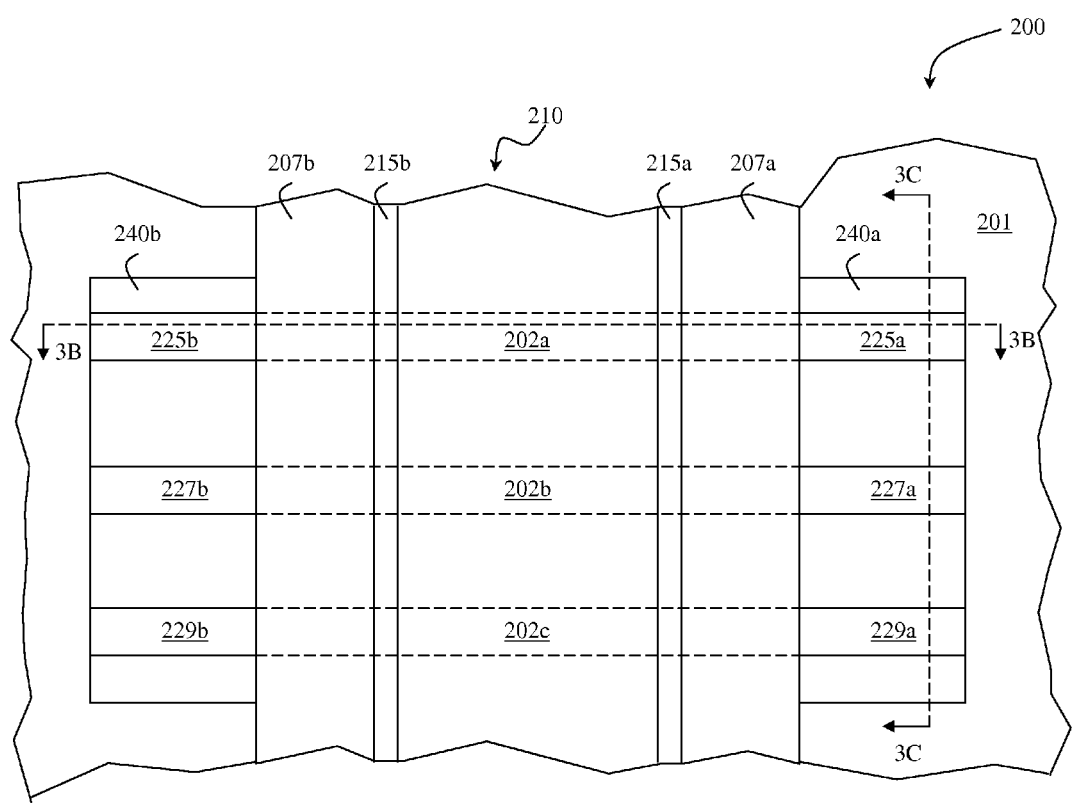
Figure 3B:
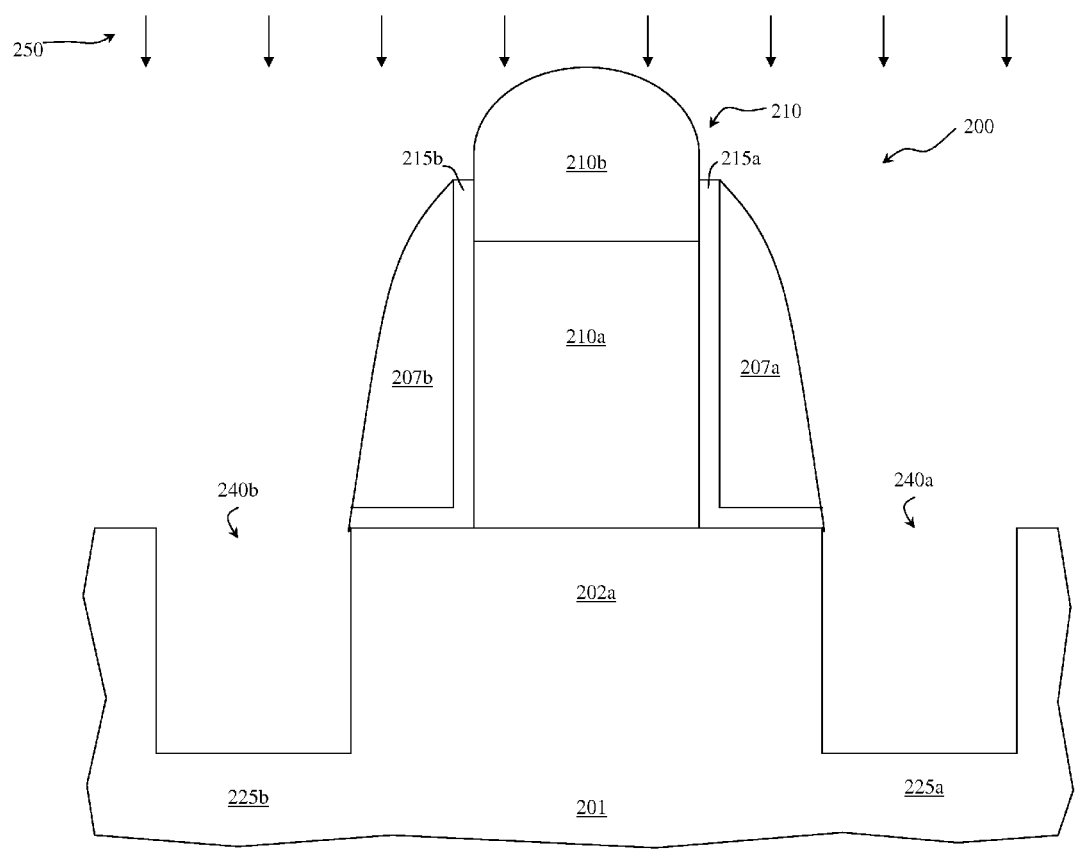
Figure 3C:
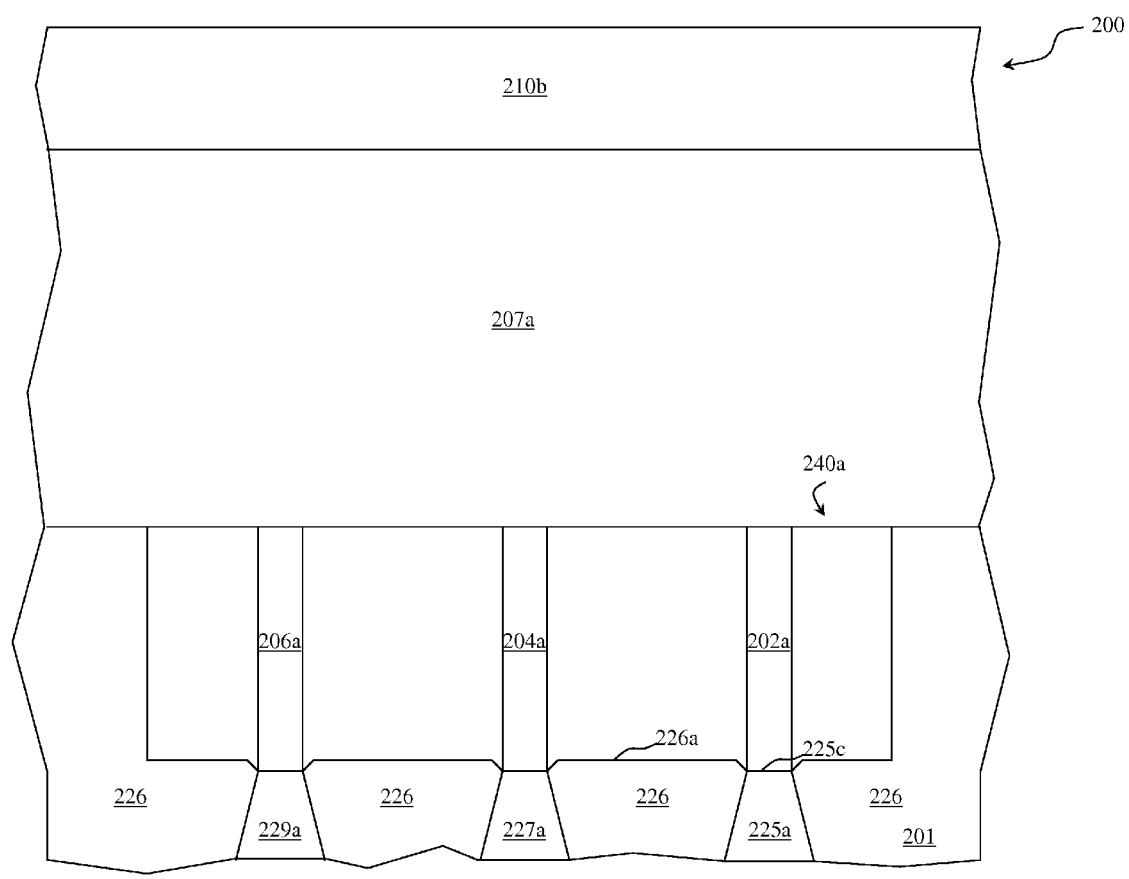

Referring to FIGS. 3A-3C, a removing process 250 (shown in FIG. 3B) can remove portions of the fins 209a-209c and a portion of the isolation structure 226, forming trench openings 240a and 240b that are substantially parallel with the gate structure 210. In this embodiment, the removing process 250 can also define fin-channel bodies 202a, 204a, and 206a under the gate structure 210. The remaining portions of the fins 209a-209c can be referred to as active areas 225a, 227a, and 229a, respectively (shown in FIG. 3C).

It is noted that the trench openings 240a and 240b shown in FIGS. 3A-3C is merely exemplary. In other embodiments, a single trench opening can be defined and continuously extend around the gate structure 210 from the top view of the integrated circuit 200. In still other embodiments, the removing process 250 can use the spacers 207a-207b and the cap layer 210b as a hard mask to remove the portions of the fins 209a-209c and the portion of the isolation structure 226.

The removing process 250 can include at least one dry etch process, at least one wet etch process, other known etch processes, or any combinations thereof. In some embodiments, the removing process 250 can include an isotropic dry etching step using an argon (Ar) bombardment to remove the portions of the fins 209a-209c and the portion of the isolation structure 226.

Referring to FIG. 3C, the removing process 250 can have a higher etch rate to the fins 209a-209c (shown in FIG. 2C) to the isolation structure 226. In this embodiment, a top surface 226a of the isolation structure 226b can be higher than a top surface 225c of the active area 225a (shown in FIG. 3C). In other embodiments, the removing process 250 can have an etch rate to the fins 209a-209c that is substantially equal to the isolation structure 226. The top surface 226a of the isolation structure 226b can be substantially level with the top surface 225c of the active area 225a.

Figure 4A:
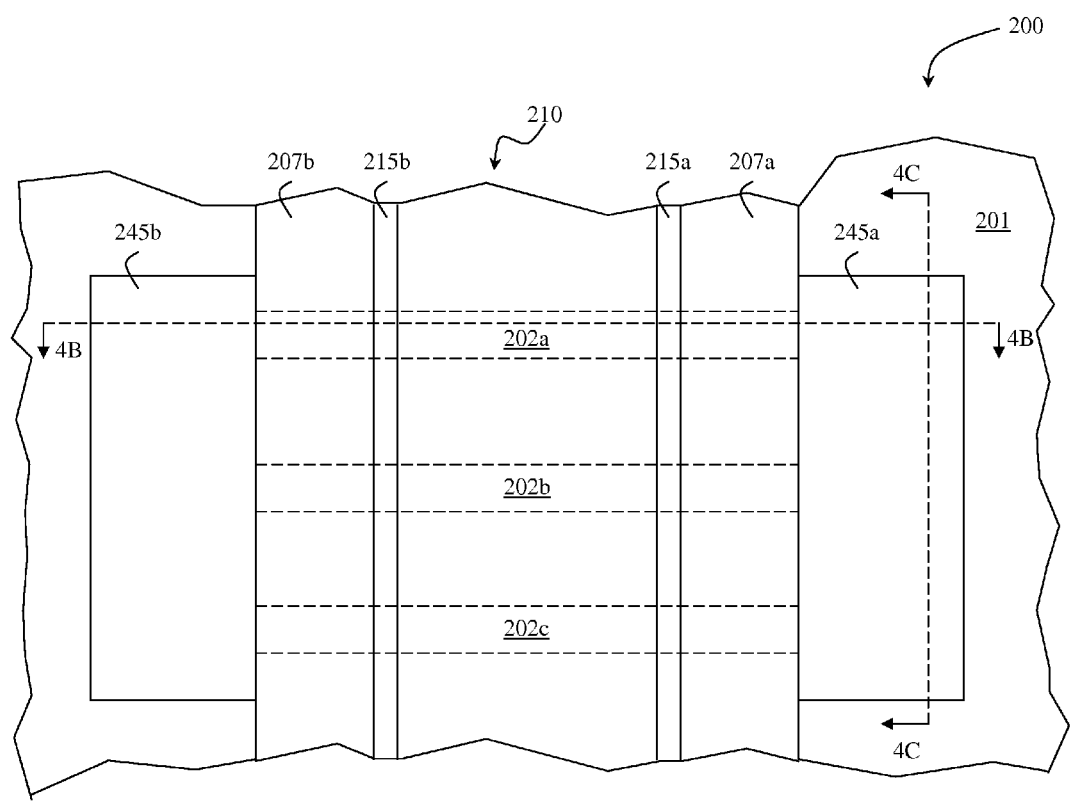
Figure 4B:
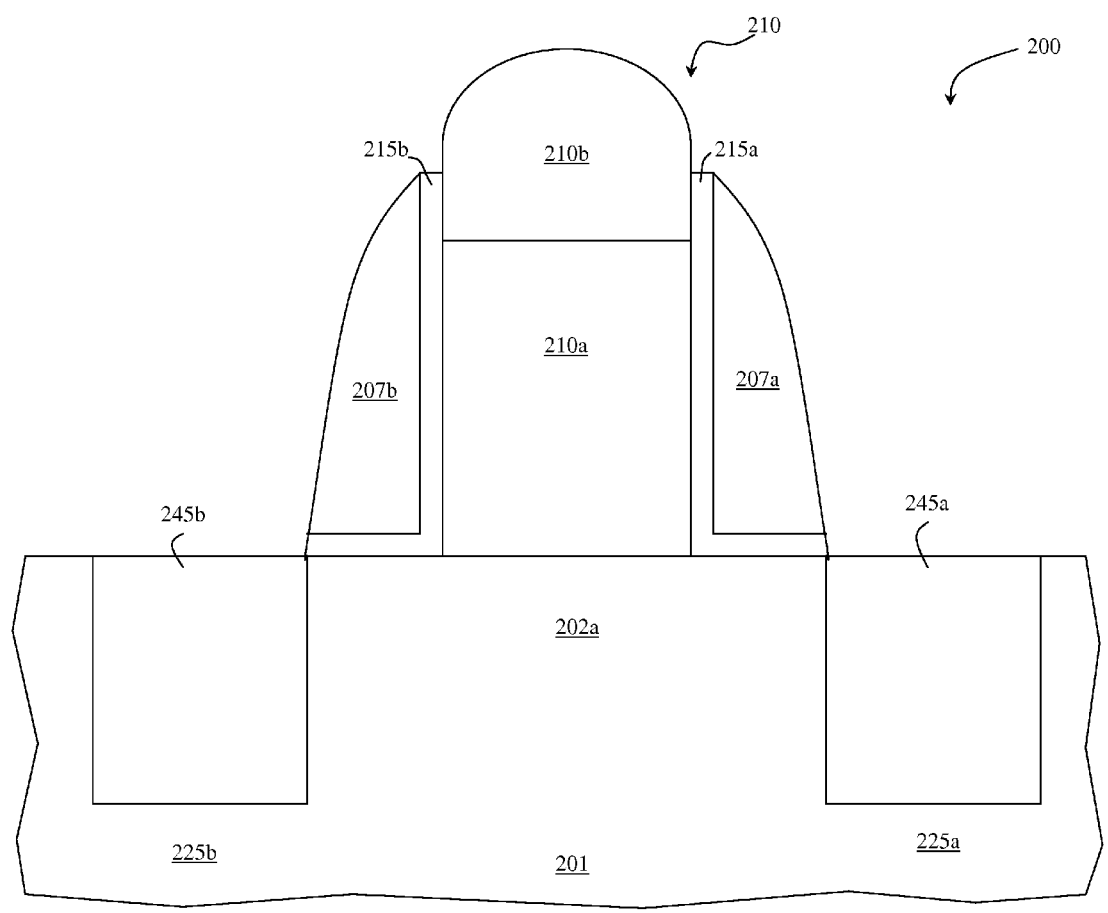
Figure 4C:
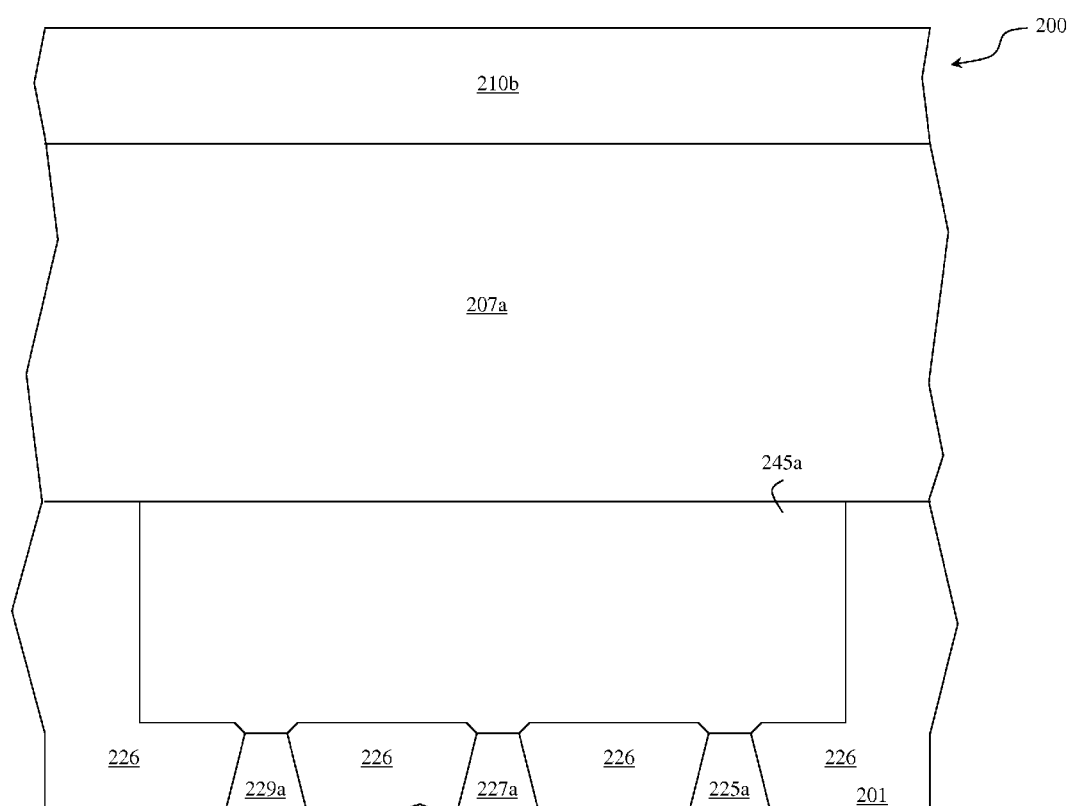

Referring to FIGS. 4A-4C, at least one epitaxial material, e.g., epitaxial materials 245a and 245b, can be formed within the trench openings 240a and 240b, respectively. In some embodiments, the epitaxial materials 245a and 245b can be selectively grown from the active areas 225a and 225b, respectively, as shown in FIG. 4B. In other embodiments, as-grown epitaxial materials can be selectively grown from the active areas 225a, 227a, and 229a such that the as-grown epitaxial materials can laterally extend and merge to form the epitaxial material 245a as shown in FIG. 4C.

In some embodiments, the epitaxial materials 245a and 245b can each be made of at least one elementary semiconductor such as silicon, germanium, or carbon; compound semiconductor such as silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. The epitaxial materials 245a and 245b can be formed by chemical vapor deposition (CVD), e.g., low pressure CVD (LPCVD), atomic layer CVD (ALCVD), ultrahigh vacuum CVD (UH-VCVD), reduced pressure CVD (RPCVD), or any suitable CVD; molecular beam epitaxy (MBE) process; or any suitable epitaxial process.

Figure 5A:
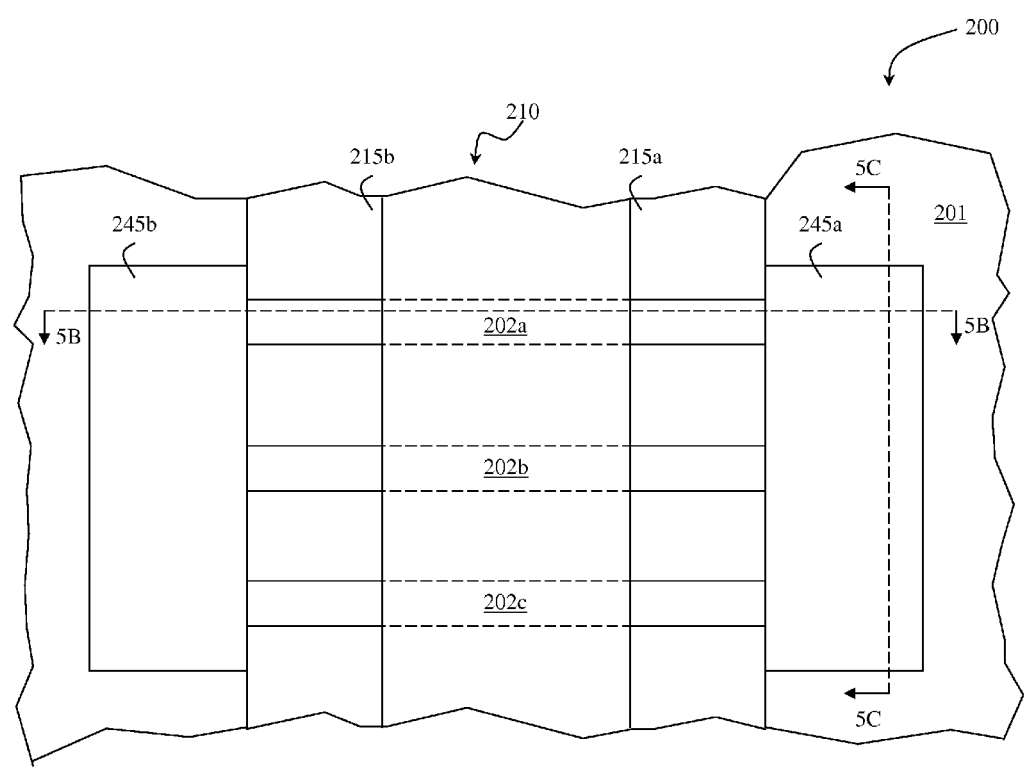
Figure 5B:
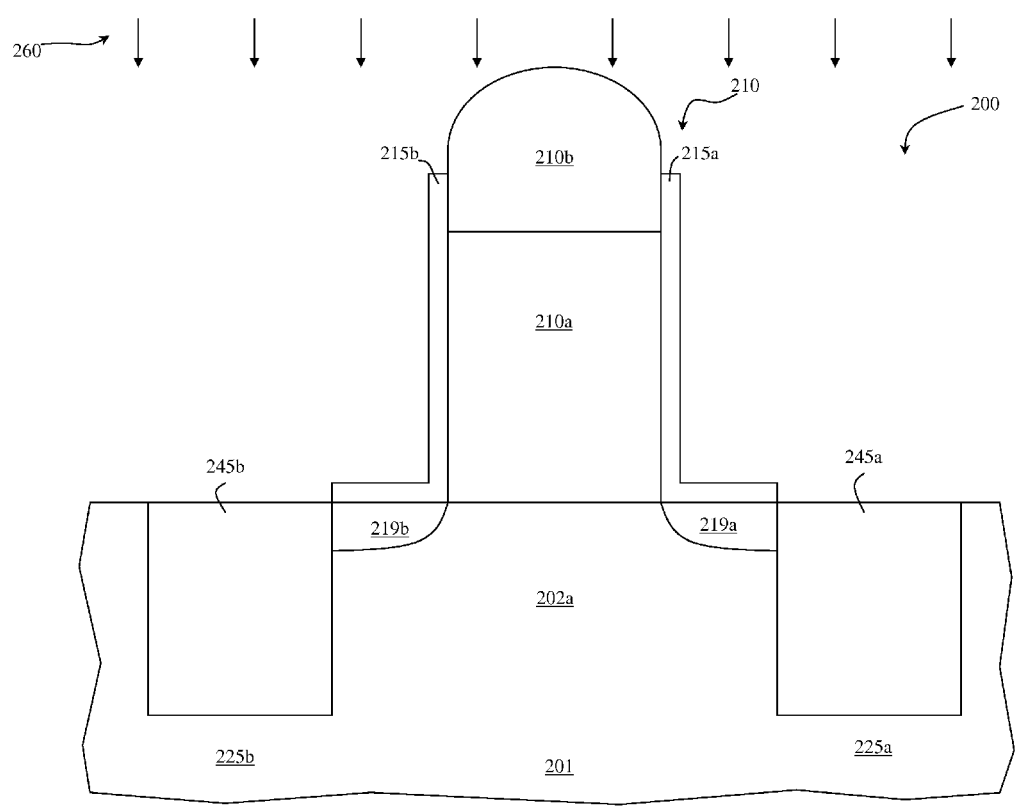
Figure 5C:
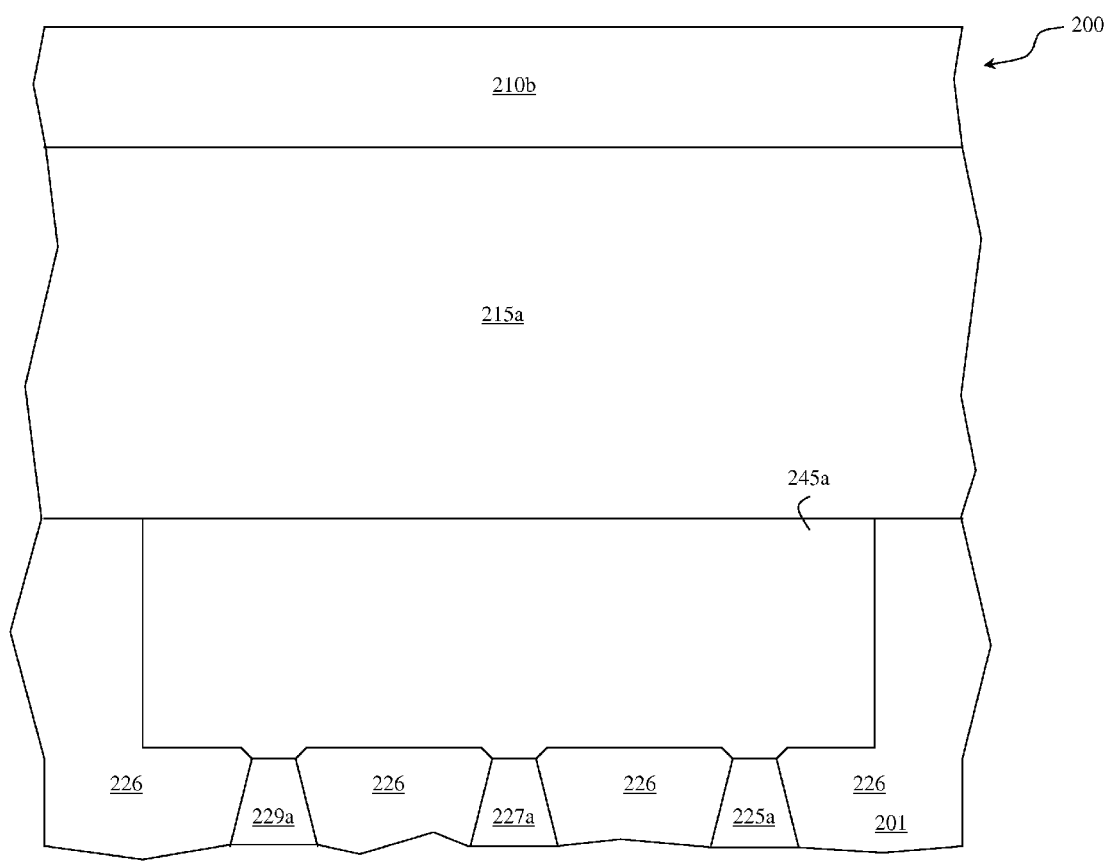

Referring to FIGS. 5A-5C, a removing process 260 (shown in FIG. 5B) can remove the spacers 207a-207b (shown in FIG. 4B). The removing process 260 can include at least one wet etch process, at least one dry etch process, another known etch process that has a desired etch selectivity of the spacers 207a-207b to the cap layer 210b, liners 215a-215b, and/or the epitaxial materials 245a-245b, or any combination thereof.

After removing the spacers 207a-207b, LDDs 219a and 219b can be formed adjacent to the gate electrode 210a and below the liners 215a and 215b, respectively. The LDDs 219a and 219b can be formed by an implantation process (not shown). In some embodiments forming n-type LDDs, the implantation process can implant dopants such as arsenic (As), phosphorus (P), another group V element, or any combinations thereof, into the fin-channel body 202a. For embodiments forming p-type LDDs, the implantation process can implant dopants such as boron (B), another group III element, or any combinations thereof, into the fin-channel body 202a. It is noted that the processes for forming the LDDs 219a and 219b described above in conjunction with FIGS. 5A-5C are optional. In some embodiments, if no LDD is to be formed, the processes described above in conjunction with FIGS. 5A-5C can be saved.

Figure 6A:
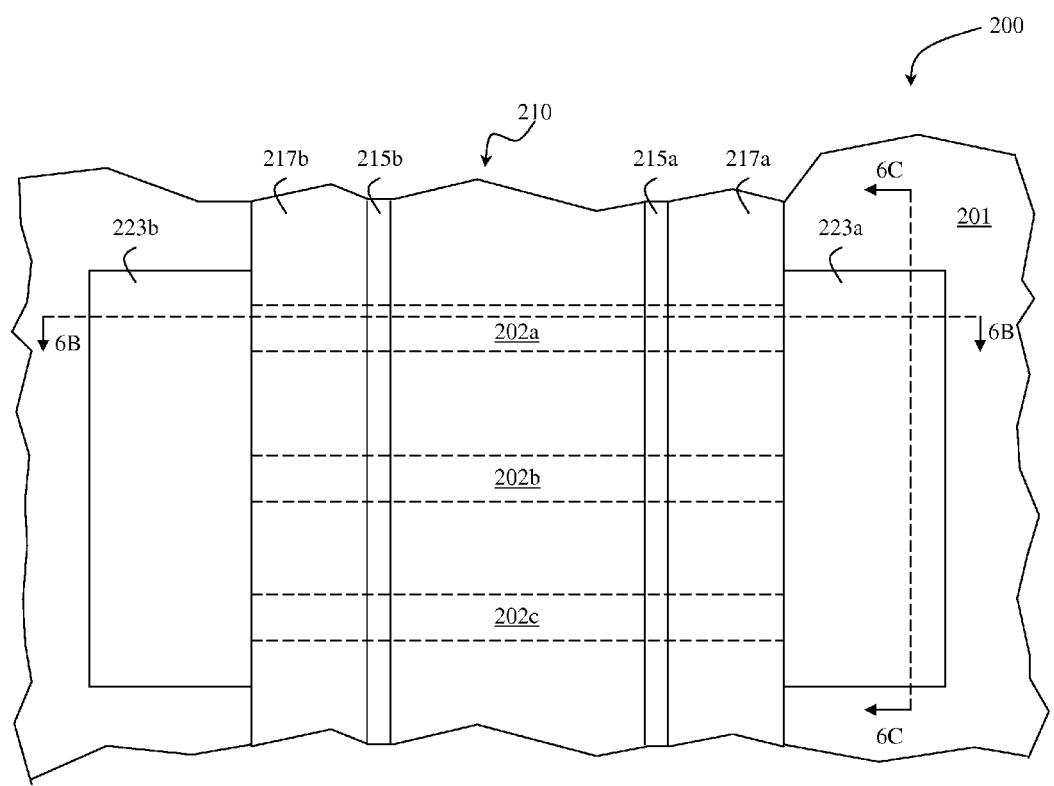
Figure 6B:
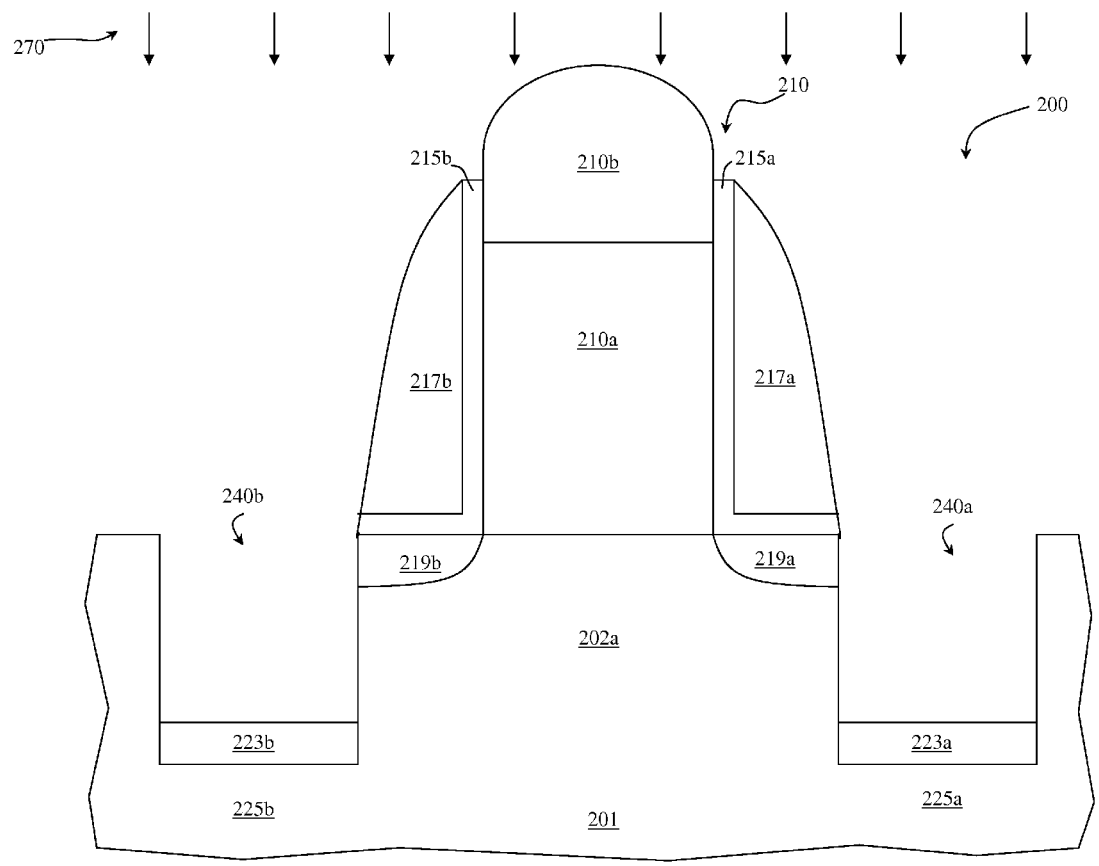
Figure 6C:
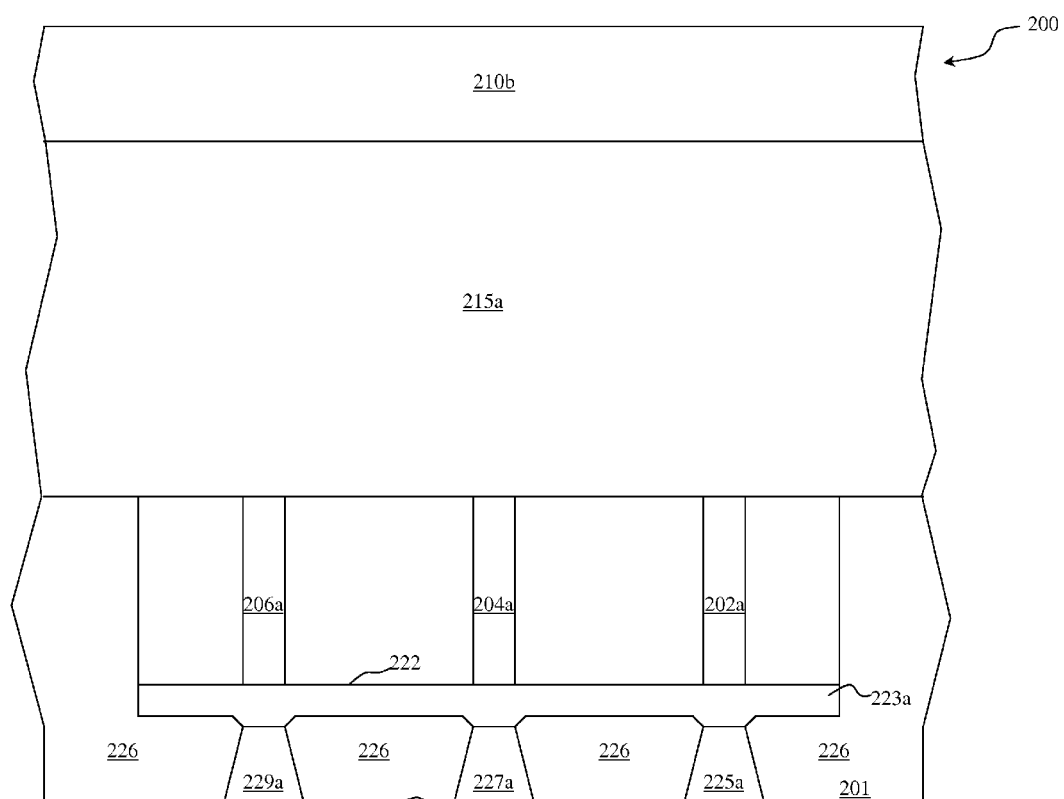

Referring to FIGS. 6A-6C, spacers 217a and 217b can be formed on sidewalls of the liners 215a and 215b, respectively. To form the spacers 217a and 217b, a dielectric material (not shown) can be formed over the structure shown in FIG. 6B. The dielectric material can be formed, for example, by a CVD process. An etch-back process can remove portions of the dielectric material to define the spacers 217a and 217b on the sidewalls of the liners 215a and 215b, respectively.

After forming the spacers 217a and 217b, a removing process 270 can remove portions of the epitaxial materials 245a and 245b, defining epitaxial regions 223a and 223b, respectively, in the trench openings 240a and 240b, respectively. The removing process 270 can include at least one known dry etch process, at least one known wet etch process, or any combinations thereof. In some embodiments, the removing process 270 can include an isotropic dry etch process using an argon (Ar) bombardment to remove portions of the epitaxial materials 245a and 245b. In some embodiments, the removing process 270 can remove a portion of the epitaxial material 245a such that the top surface 222 of the epitaxial region 223a can be substantially flat as shown in FIG. 6C. In other embodiments, the removing process 270 can remove the portion of the epitaxial material 245a, separating the portions of the epitaxial region 223a on the active areas 225a, 227a, and 229a from each other.

Figure 7A:
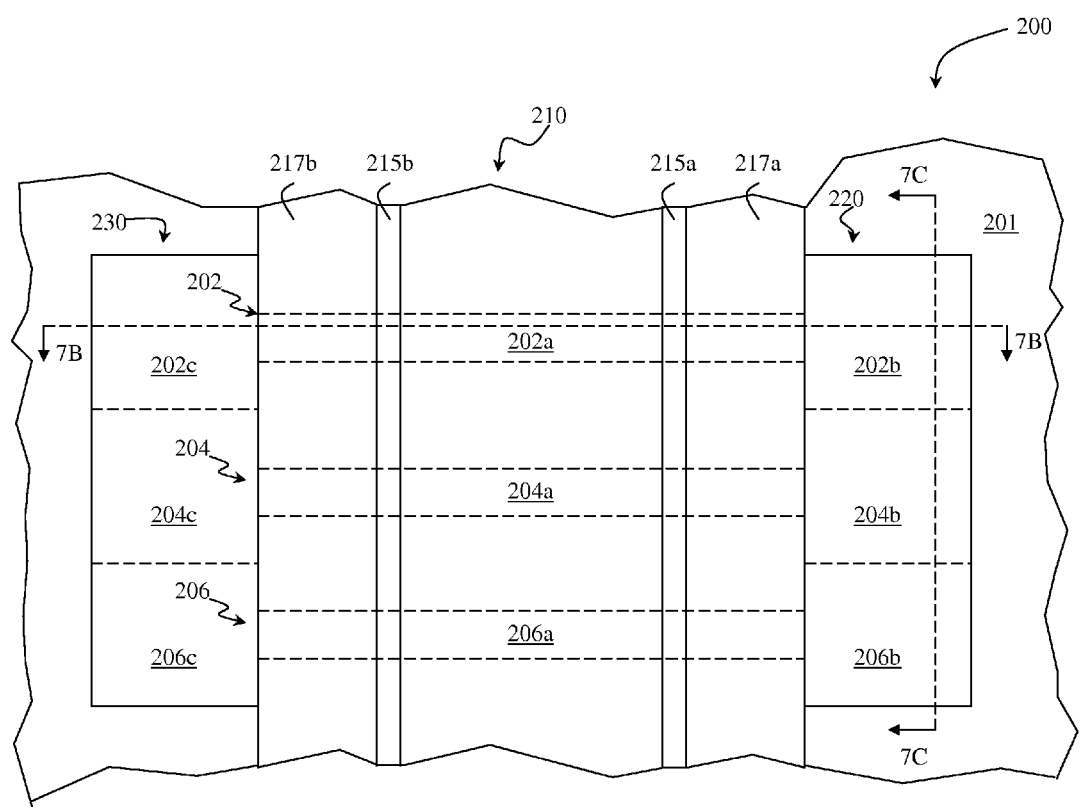
Figure 7B:
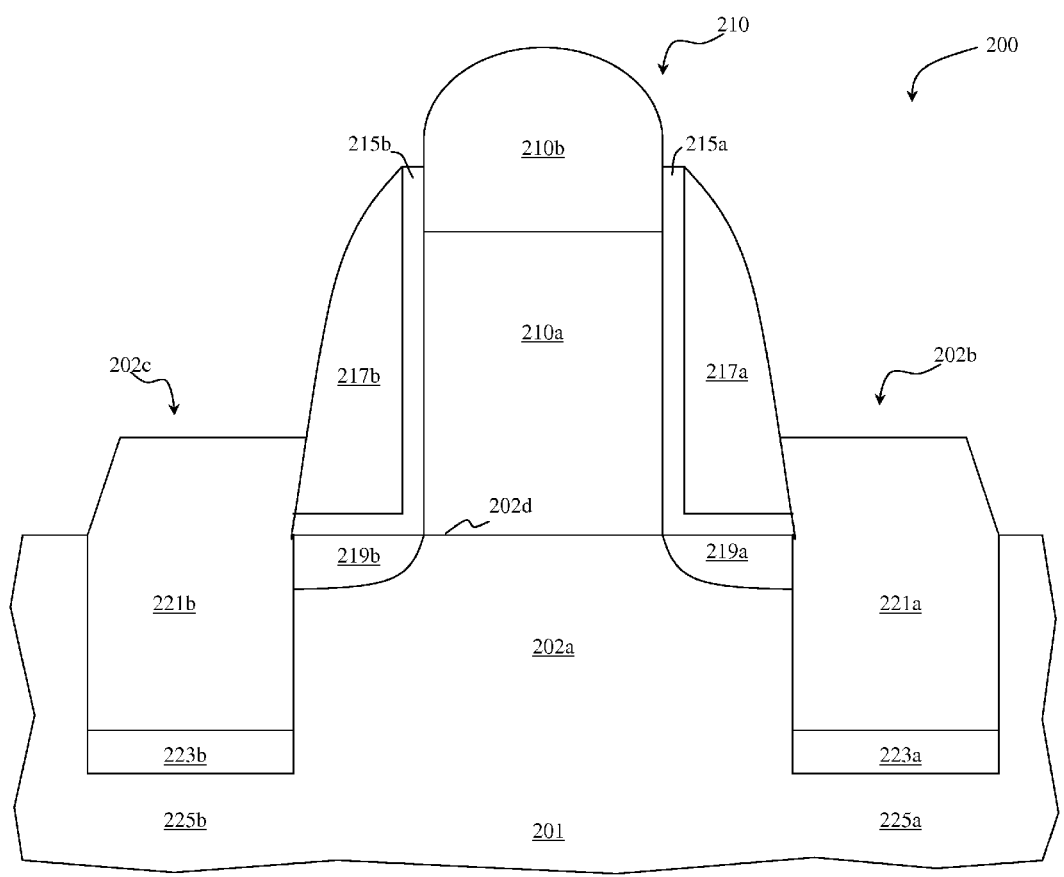
Figure 7C:
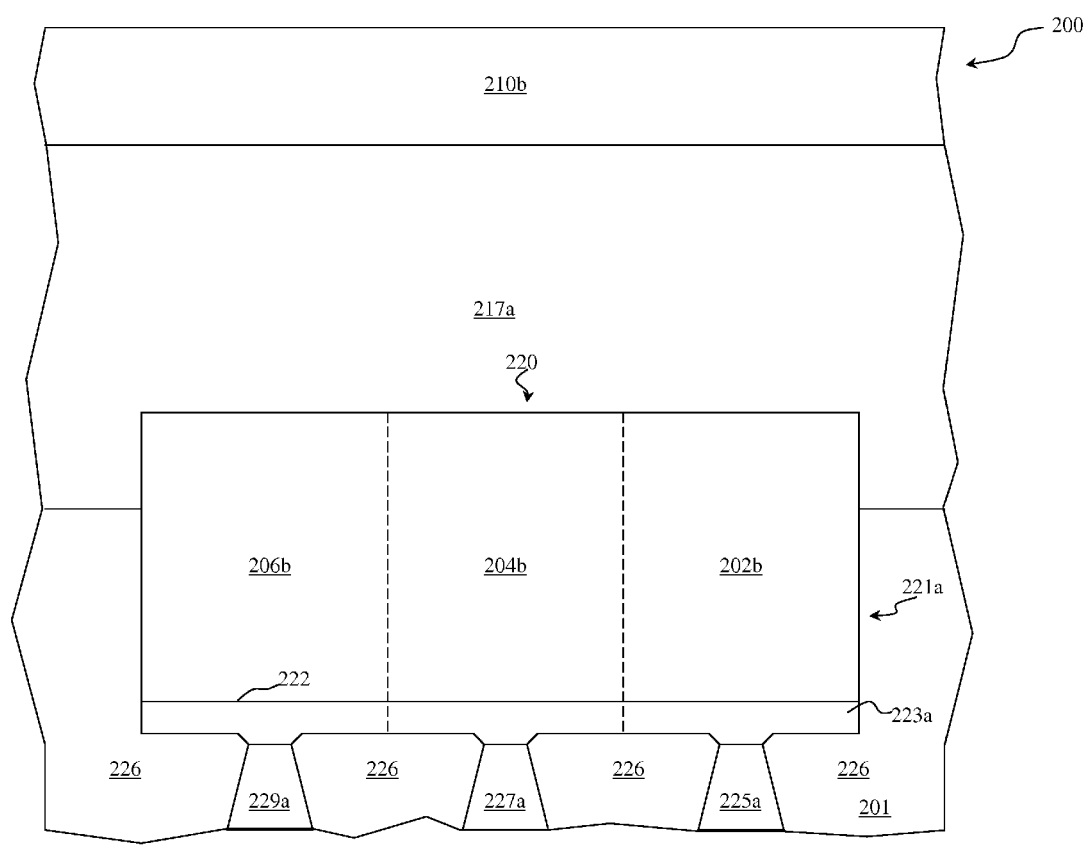

Referring to FIGS. 7A-7C, epitaxial regions 221a and 221b can be formed within the trench openings 240a and 240b shown in FIG. 6B. In some embodiments, the epitaxial regions 221a and 221b can be selectively grown from the epitaxial regions 223a and 223b, respectively, as shown in FIG. 7B. Since the top surface of the epitaxial region 223a (shown in FIG. 7C) is substantially flat, the epitaxial region 221a can be uniformly grown from the epitaxial region 223a. The S/D regions 202b, 204b, and 206b can be electrically coupled with each other. In some embodiments, the epitaxial regions 221a and 221b can extend over a top surface 202d of the fin-channel body 202a (shown in FIG. 7B). In some embodiments, after the formation of the fins 209a-209b (shown in FIG. 2A), no photolithographic process is performed between the processes described above in conjunction from FIGS. 2A-2C and the processes described above in conjunction to 7A-7C.

In some embodiments, the epitaxial regions 221a and 221b can each be made of at least one elementary semiconductor such as silicon, germanium, or carbon; compound semiconductor such as silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. The epitaxial regions 221a and 221b can be formed by chemical vapor deposition (CVD), e.g., low pressure CVD (LPCVD), atomic layer CVD (ALCVD), ultrahigh vacuum CVD (UHVCVD), reduced pressure chemical vapor deposition (RPCVD), or any suitable CVD; molecular beam epitaxy (MBE) process; or any suitable epitaxial process.

In some embodiments, the method of forming the integrated circuit 200 can include salicidating at least a portion of the epitaxial regions 221a and 221b. The silicide of the epitaxial regions 221a and 221b can provide a desired conductivity. The silicide may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a RTP. The reacted silicide may require a one step RTP or multiple step RTPs.

In some embodiments, the method of forming the integrated circuit 200 can include forming at least one dielectric structure (not shown) over the structure shown in FIG. 7B. The dielectric structure may include materials such as oxide, nitride, oxynitride, low-k dielectric material, ultra low-k dielectric material, or any combinations thereof. The dielectric structure may be formed by, for example, a CVD process, a HDP CVD process, a HARP, a spin-coating process, other deposition process, and/or any combinations thereof.

In embodiments, contact plugs, via plugs, metallic regions, and/or metallic lines can be formed within the dielectric structure for interconnection. The contact plugs, via plugs, metallic regions, and/or metallic lines can include materials such as tungsten, aluminum, copper, titanium, tantalum, titanium nitride, tantalum nitride, nickel silicide, cobalt silicide, other proper conductive materials, and/or combinations thereof. The contact plugs, via plugs, metallic regions, and/or metallic lines can be formed by any suitable processes, such as deposition, photolithography, and etching processes, and/or combinations thereof. It is noted that the method described above in conjunction with FIGS. 2A-2C to 7A-7C are merely exemplary. The method can be a gate-first process or a gate-last process. The scope of the present application is not limited thereto.

In some embodiments, the integrated circuit 100 can be formed within a package that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system including the integrated circuit 100 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit including a plurality of Fin field effect transistors (FINFETs), the integrated circuit comprising:

a substrate;
a plurality of fin-channel bodies over the substrate, the fin-channel bodies including a first fin-channel body and a second fin-channel body;
a gate structure disposed over the fin-channel bodies;
at least one first source/drain (S/D) region of a first FINFET adjacent the first fin-channel body; and
at least one second S/D region of a second FINFET adjacent the second fin-channel body, wherein the at least one first S/D region is electrically coupled with the at least one second S/D region, and the at least one first and second S/D regions are substantially free from including the first fin-channel body and the second fin-channel body,
wherein the at least one first and second S/D regions each includes a first epitaxial region over a second epitaxial region, the first epitaxial region and the second epitaxial region are disposed in at least one trench opening defined substantially parallel with the gate structure, and an entire lower interface between the first epitaxial region and the second epitaxial region is substantially flat.

2. The integrated circuit of claim 1, wherein a depth of the at least one trench opening is substantially equal to a height of one of the fin-channel bodies.

3. The integrated circuit of claim 1, wherein the first epitaxial region is capable of providing a larger strain to the fin-channel bodies than the second epitaxial region.

4. The integrated circuit of claim 1, wherein the first epitaxial region extends over a portion of a top surface of the fin-channel bodies.

5. The integrated circuit of claim 1 further comprising:
an active area under the second epitaxial region; and
at least one isolation structure under the second epitaxial region and adjacent to the active area, wherein a top surface of the at least one isolation structure is substantially level with or higher than a top surface of the active area.

6. An integrated circuit including a plurality of Fin field effect transistors (FINFETs), the integrated circuit comprising:
a plurality of fin-channel bodies over a substrate;
a gate structure disposed over and substantially orthogonal to the fin-channel bodies; and
at least one strain structure disposed adjacent the fin-channel bodies, wherein the at least one strain structure includes a first epitaxial region over a second epitaxial region, and an entire lower interface between the first epitaxial region and the second epitaxial region is substantially flat.

7. The integrated circuit of claim 6, wherein the at least one strain structure is disposed in at least one trench opening and extends over a portion of a top surface of the fin-channel bodies.

8. The integrated circuit of claim 7, wherein a depth of the at least one trench opening is substantially equal to a height of the fin-channel bodies.

9. The integrated circuit of claim 6, wherein the first epitaxial region is capable of providing a larger strain to the fin-channel bodies than the second epitaxial region.

10. The integrated circuit of claim 6, wherein the first epitaxial region extends over a portion of a top surface of the fin-channel bodies.

11. The integrated circuit of claim 6 further comprising:
an active area under the second epitaxial region; and
at least one isolation structure under the second epitaxial region and adjacent to the active area, wherein a top surface of the at least one isolation structure is substantially level with or higher than a top surface of the active area.

12. A method of forming a plurality of Fin field effect transistors (FINFETs), the method comprising:
forming a plurality of fin-channel bodies over a substrate, the fin-channel bodies including a first fin-channel body and a second fin-channel body;
forming a gate structure disposed over the fin-channel bodies;
forming a trench opening in the substrate adjacent the gate structure;
forming an epitaxial region in the trench opening, an entire upper surface of the epitaxial region being substantially flat;
forming another epitaxial region in the trench opening and over the upper surface of the epitaxial region.

13. The method of claim 12, wherein the forming the epitaxial region and the forming the another epitaxial region over the epitaxial region comprise:
selectively forming an epitaxial material in the trench opening;
removing at least a portion of the epitaxial material to define the epitaxial region; and
selectively forming the another epitaxial region over the epitaxial region.

14. The method of claim 13, wherein selectively forming the another epitaxial region over the epitaxial region comprises:
forming the another epitaxial region extending over a portion of a top surface of the fin-channel bodies.

15. The method of claim 12, wherein the first epitaxial region is capable of providing a larger strain to the fin-channel bodies than the second epitaxial region.

16. The integrated circuit of claim 1, wherein the first epitaxial region and the second epitaxial region each includes a material comprising silicon or germanium.

17. The integrated circuit of claim 1, wherein the first epitaxial region and the second epitaxial region each includes a material comprising a gradient silicon germanium composition.

18. The integrated circuit of claim 1, wherein the first fin-channel body and the second fin-channel body each includes a lightly-doped drain region.

19. The integrated circuit of claim 6, wherein the first epitaxial region and the second epitaxial region each includes a material comprising silicon or germanium.

20. The integrated circuit of claim 6, wherein the first epitaxial region and the second epitaxial region each includes a material comprising a gradient silicon germanium composition.

21. The integrated circuit of claim 6, wherein the fin-channel bodies each includes a lightly-doped drain region.

22. The method of claim 12, further comprising performing an implantation process on the fin-channel bodies to form corresponding lightly-doped drain regions.

* * * * *